(12) United States Patent
Lin et al.

(10) Patent No.: US 10,217,723 B2
(45) Date of Patent: Feb. 26, 2019

(54) SEMICONDUCTOR PACKAGE WITH IMPROVED BANDWIDTH

(71) Applicant: MEDIATEK INC., Hsin-Chu (TW)

(72) Inventors: Tzu-Hung Lin, Hsinchu County (TW); I-Hsuan Peng, Hsinchu (TW); Nai-Wei Liu, Kaohsiung (TW); Wei-Che Huang, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/644,849

(22) Filed: Jul. 10, 2017

(65) Prior Publication Data

US 2018/0102343 A1 Apr. 12, 2018

Related U.S. Application Data

(60) Provisional application No. 62/405,286, filed on Oct. 7, 2016.

(51) Int. Cl.
*H01L 23/00* (2006.01)
*H01L 25/00* (2006.01)
(Continued)

(52) U.S. Cl.
CPC ........ *H01L 25/0655* (2013.01); *H01L 21/561* (2013.01); *H01L 21/78* (2013.01); *H01L 23/3128* (2013.01); *H01L 23/5386* (2013.01); *H01L 23/5389* (2013.01); *H01L 24/06* (2013.01); *H01L 24/19* (2013.01); *H01L 24/20* (2013.01); *H01L 24/24* (2013.01); *H01L 29/0657* (2013.01); *H01L 24/13* (2013.01); *H01L 2224/04105* (2013.01); *H01L 2224/12105* (2013.01); *H01L 2224/13024* (2013.01); *H01L 2224/24137* (2013.01); *H01L 2224/94* (2013.01); *H01L 2924/10155* (2013.01); *H01L 2924/1433* (2013.01); *H01L 2924/1436* (2013.01); *H01L 2924/15311* (2013.01); *H01L 2924/18162* (2013.01)

(58) Field of Classification Search
CPC ............. H01L 23/3128; H01L 23/5386; H01L 25/0655; H01L 25/0652; H01L 25/071; H01L 25/072; H01L 25/10
See application file for complete search history.

(56) References Cited

U.S. PATENT DOCUMENTS

| 2002/0030285 A1 | 3/2002 | Sawada |
| 2005/0024958 A1 | 2/2005 | Masui |

(Continued)

FOREIGN PATENT DOCUMENTS

| EP | 3 070 739 A2 | 9/2016 |
| EP | 3 070 739 A3 | 12/2016 |
| TW | 201030943 A1 | 8/2010 |

*Primary Examiner* — Cuong Q Nguyen
(74) *Attorney, Agent, or Firm* — Winston Hsu

(57) ABSTRACT

A semiconductor chip package includes a first die and a second die. The first die and second die are coplanar and disposed in proximity to each other in a side-by-side fashion. A non-straight line shaped interface gap is disposed between the first die and second die. A molding compound surrounds the first die and second die. A redistribution layer (RDL) structure is disposed on the first die, the second die and on the molding compound. The first semiconductor die is electrically connected to the second semiconductor die through the RDL structure.

18 Claims, 8 Drawing Sheets

(51) Int. Cl.
  *H01L 25/065* (2006.01)
  *H01L 21/56* (2006.01)
  *H01L 21/78* (2006.01)
  *H01L 23/31* (2006.01)
  *H01L 23/538* (2006.01)
  *H01L 29/06* (2006.01)

(56) References Cited

U.S. PATENT DOCUMENTS

| | | | |
|---|---|---|---|
| 2011/0073996 A1* | 3/2011 | Leung | H01L 25/0655 257/620 |
| 2012/0091567 A1 | 4/2012 | Pagaila | |
| 2013/0320565 A1* | 12/2013 | Griswold | H01L 25/0655 257/777 |
| 2014/0239514 A1 | 8/2014 | Haba | |
| 2015/0130070 A1 | 5/2015 | Lin | |
| 2015/0364422 A1 | 12/2015 | Zhai | |
| 2016/0218082 A1* | 7/2016 | Lee | H01L 23/5386 |

* cited by examiner

SEMICONDUCTOR PACKAGE WITH IMPROVED BANDWIDTH

CROSS REFERENCE TO RELATED APPLICATIONS

This application claims priorities from U.S. provisional application No. 62/405,286 filed Oct. 7, 2016, which is included herein in its entirety by reference.

BACKGROUND

The present invention relates generally to semiconductor packaging and, more particularly, to a semiconductor chip package having two smaller dies split from a large die arranged in a side-by-side fashion with high bandwidth.

As known in the art, the die yield loss is positively correlated with the die size. The fabrication of large-sized dies on a wafer typically suffers from low yield and high cost. To improve the production yield, for example, a larger sized chip such as a network switch chip may be broken (or split) into two smaller sized dies having identical circuit module design in a wafer level scale.

When assembling, the two smaller sized dies having identical circuit module design singulated from the same wafer are packaged in a side-by-side fashion and die-to-die connection paths are provided in a redistribution layer or a substrate to connect the respective input/output (I/O) pads of the two smaller sized dies.

In this technical field, it is always desirable to provide an improved chip package having high bandwidth.

SUMMARY

It is one object of the present invention to provide an improved semiconductor chip package having high bandwidth.

According to one embodiment, a semiconductor chip package includes a first semiconductor die and a second semiconductor die, wherein the first semiconductor die and second semiconductor die are coplanar and disposed in proximity to each other in a side-by-side fashion; a non-straight line shaped interface gap between the first semiconductor die and second semiconductor die; a molding compound surrounding the first die and second die; and a redistribution layer (RDL) structure on the first semiconductor die, the second semiconductor die and on the molding compound, wherein the first semiconductor die is electrically connected to the second semiconductor die through the RDL structure.

According to another aspect, a semiconductor chip package includes a first semiconductor die and a second semiconductor die, wherein the first semiconductor die and second semiconductor die are coplanar and disposed in proximity to each other in a side-by-side fashion; a continuous interface gap between the first semiconductor die and the second semiconductor die separating the first semiconductor die from the second semiconductor die, wherein the continuous interface gap comprises a first gap segment extending along a first direction and a second gap segment extending along a second direction that is not in parallel with the first direction; a molding compound surrounding the first die and second die; and a redistribution layer (RDL) structure on the first semiconductor die, the second semiconductor die and on the molding compound, wherein the first semiconductor die is electrically connected to the second semiconductor die through the RDL structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
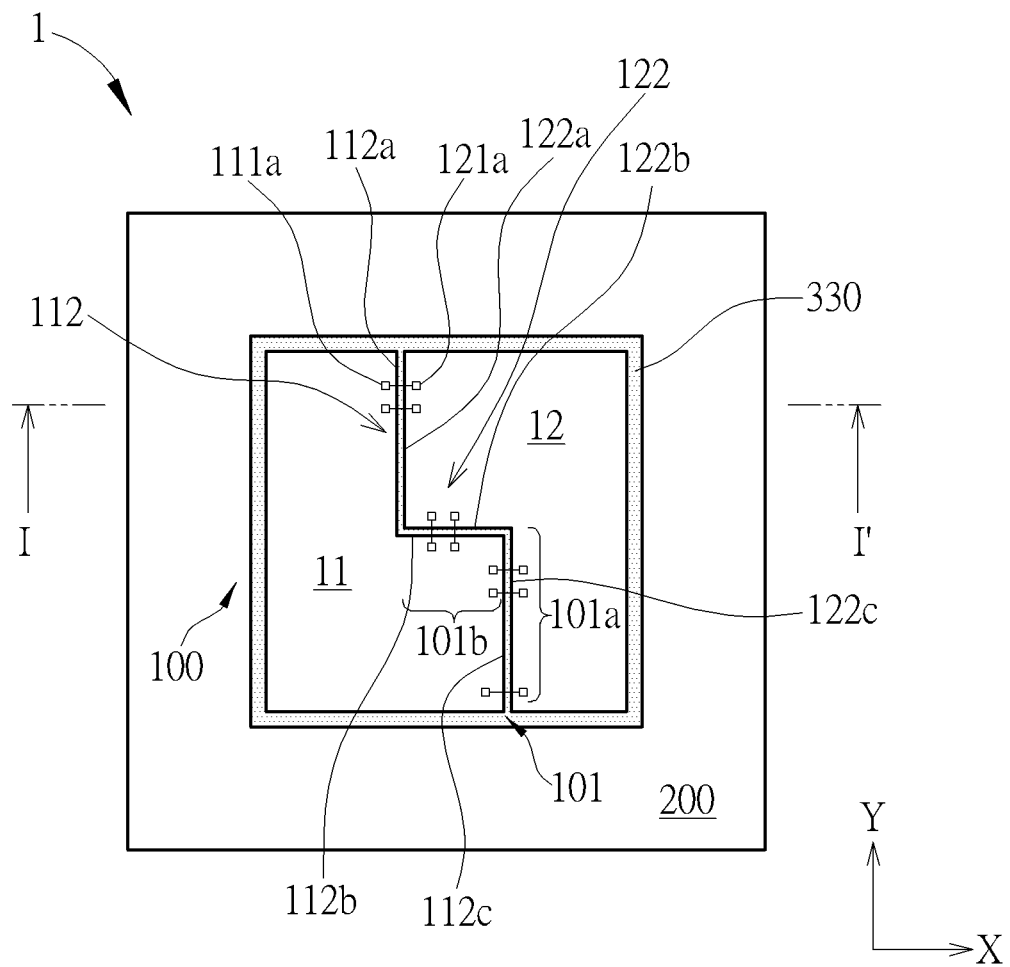
FIG. 1 is a schematic, plan view of an exemplary semiconductor chip package with improved bandwidth according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
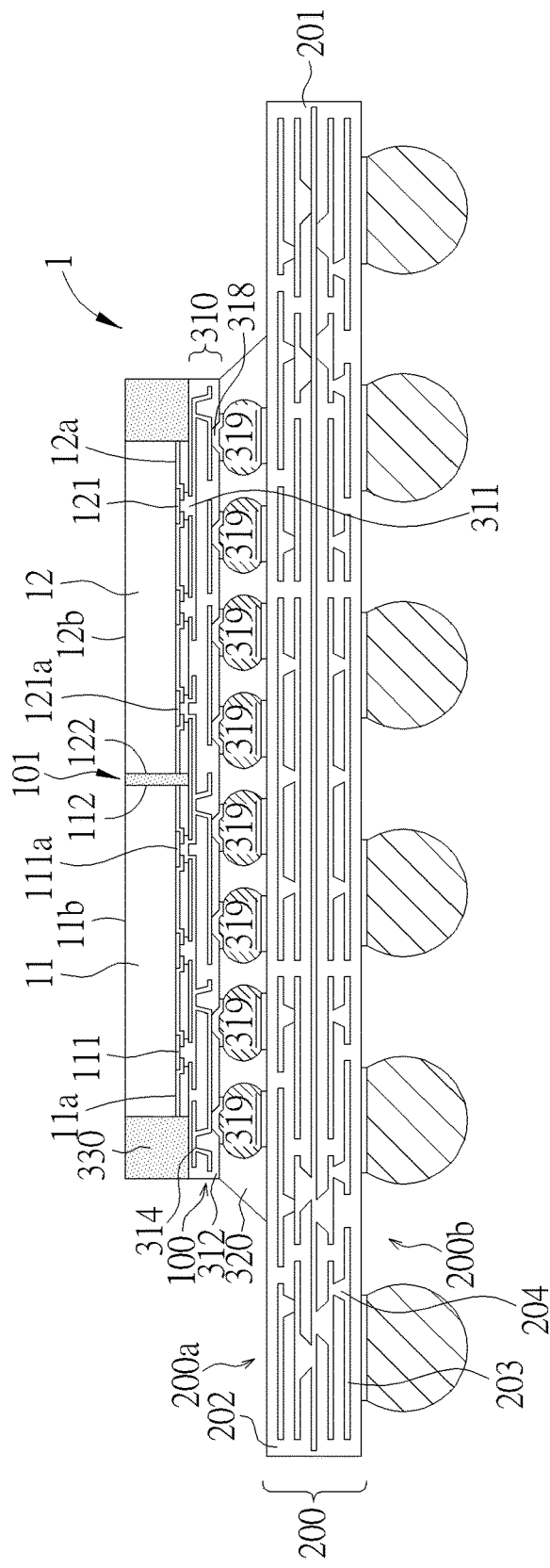
FIG. 2 is a schematic, cross-sectional view taken along line I-I' in FIG. 1.

Please refer to FIG. 1 and FIG. 2. FIG. 1 is a schematic, plan view of an exemplary semiconductor chip package with improved bandwidth according to one embodiment of the invention. FIG. 2 is a schematic, cross-sectional view taken along line I-I' in FIG. 1.

As shown in FIG. 1 and FIG. 2, a microelectronic device 1 comprises a substrate 200 and a semiconductor chip package 100 mounted on the substrate 200. According to one embodiment of the invention, the semiconductor chip package 100 may be a flip-chip package, a fan-out package, or a wafer level fan-out package (WLFO package), but are not limited thereto. In another embodiment, for example, the semiconductor chip package 100 may be a chip on wafer on substrate (CoWoS) package and a silicon interposer may be incorporated.

The substrate 200 may be a package substrate or a printed wiring board, but is not limited thereto. According to one embodiment of the invention, the substrate 200 may comprises a core 201, dielectric build-up layers 202, metal traces 203, and plated through holes (PTHs) or vias 204. It is understood that the trace patterns and internal structures of the substrate 200 as shown in FIG. 1 are for illustration purposes only.

The substrate 200 has two opposite surfaces 200a and 200b. The semiconductor chip package 100 is mounted on the surface 200a. According to one embodiment of the invention, the semiconductor chip package 100 comprises two coplanar semiconductor dies 11 and 12 arranged in close proximity to each other in a side-by-side fashion. An inter-die interface gap 101 is provided between the two coplanar semiconductor dies 11 and 12. When viewed from the above, as depicted in FIG. 1, the inter-die interface gap 101 has a non-straight line shape such as a lightning shape.

According to one embodiment of the invention, the two semiconductor dies 11 and 12 have identical circuit module design split from a target chip. The two semiconductor dies 11 and 12 are assembled in the same wafer-level package to generate and complete the target chip, for example, a network switch chip.

However, it is understood that in some embodiment, the two semiconductor dies 11 and 12 may have different circuit module designs. For example, the semiconductor die 11 may be an application specific integrated circuit (ASIC) or a system on a chip (SoC). The semiconductor die 12 may be a DRAM die or a DRAM controller chip such as a LPDDR3 or LPDDR4 memory controller.

According to one embodiment of the invention, the two semiconductor dies 11 and 12 are interconnected to each other through the redistribution layer (RDL) structure 310 interposed between the semiconductor dies 11, 12 and the surface 200a of the substrate 200.

According to one embodiment of the invention, the RDL structure 310 may comprise at least one dielectric layer 312 and at least one metal layer 314. The dielectric layer 312 may comprise organic materials such as polyimide (PI) or inorganic materials such as silicon nitride, silicon oxide or the like, but not limited thereto. The metal layer 314 may comprise aluminum, copper, tungsten, titanium, titanium nitride, or the like.

According to the illustrated embodiment, the metal layer 314 may comprise a plurality of conductive pads 318 exposed from a lower surface of the dielectric layer 312. conductive bumps 319 (or solder balls) may be formed on the conductive pads 318 to electrically connect the RDL structure 310 with the substrate 200. An underfill 320 may be provided between the RDL structure 310 and the substrate 200 to protect the conductive bumps 319. However, it is understood that, in some embodiments, the underfill 320 may be omitted.

According to one embodiment of the invention, the RDL structure 310 may be formed at a wafer level scale, which is also known as a wafer level packaging process. The RDL structure 310 is able to fan out the input/output (I/O) pads 111 on the active surface 11a of the semiconductor die 11 and the I/O pads 121 on the active surface 12a of the semiconductor die 12 beyond the edges of the two semiconductor dies 11 and 12.

As can be best seen in FIG. 2, the RDL structure 310 is fabricated on the active surfaces 11a and 12a of the two semiconductor dies 11 and 12 and on the adjacent surface of a molding compound 330. Micro bumps 311 may be formed on the I/O pads 111 and 121, respectively, to electrically connect the I/O pads 111 and 121 to the metal layer 314 of the RDL structure 310.

The molding compound 330 encapsulates the two semiconductor dies 11 and 12. Optionally, molding compound 330 may be subjected to a polishing process to remove a portion of the molding compound 330 from the inactive surfaces 11b and 12b of the two semiconductor dies 11 and 12. The molding compound 330 may comprise a mixture of epoxy and silica fillers, but not limited thereto. The inter-die interface gap 101 is completely filled with the molding compound 330.

As can be best seen in FIG. 1, the semiconductor die 11 has an L-shaped profile and the semiconductor die 12 has a reversed L-shaped profile, such that the semiconductor die 11 engages with the semiconductor die 12 to complete a target chip having a rectangular outline. However, it is to be understood that the shapes of the semiconductor dies 11 and 12 in FIG. 1 are for illustration purposes only.

According to one embodiment of the invention, the continuous, inter-die interface gap 101 between the semiconductor die 11 and the semiconductor die 12 separates the semiconductor die 11 from the semiconductor die 12. The continuous, inter-die interface gap 101 is a non-straight line shaped interface gap. As shown in FIG. 1, the continuous, inter-die interface gap 101 comprises a first gap segment 101a extending along a first direction (e.g., reference y-axis direction) and a second gap segment 101b extending along a second direction (e.g., reference x-axis direction). The second direction is not in parallel with the first direction.

Figure 3:
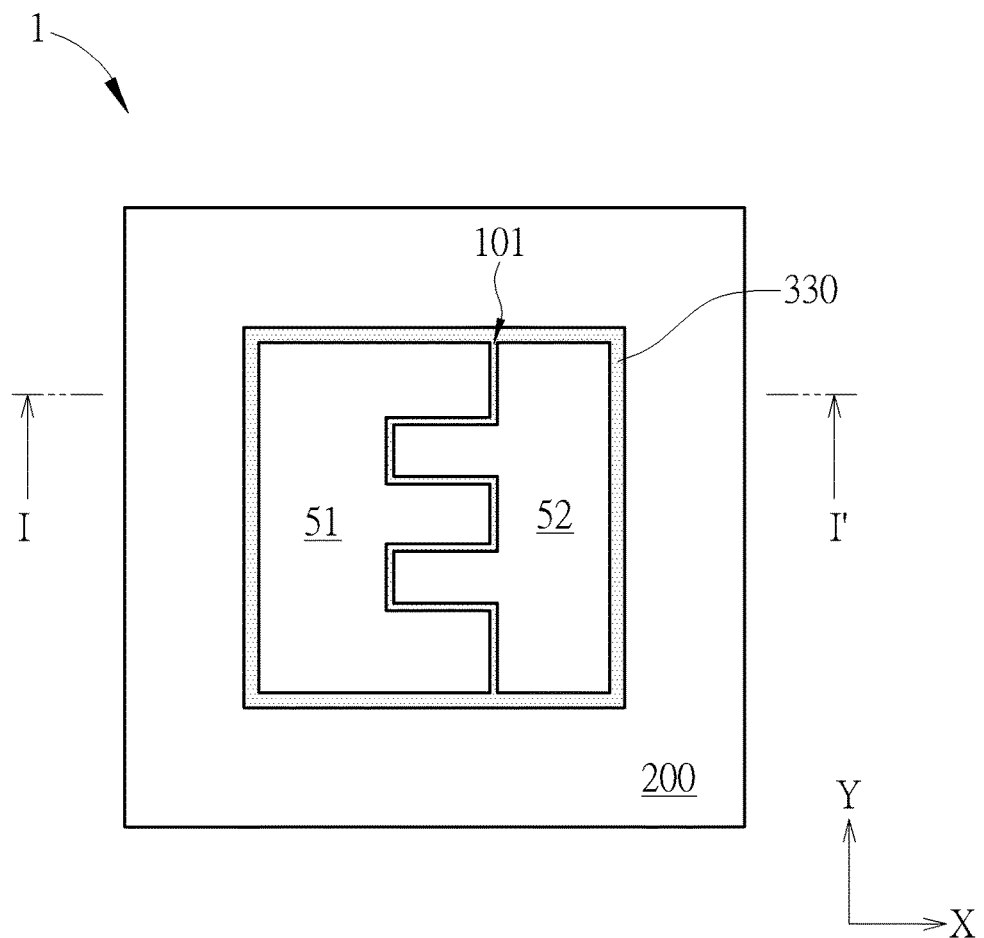
FIG. 3 is a schematic, plan view of a semiconductor chip package with improved bandwidth according to another embodiment of the invention.

In some embodiments, the continuous, inter-die interface gap 101 between the semiconductor dies 11 and 12 may have various non-straight line shapes such as a serpentine shape when viewed from the above. The semiconductor die 11 may have a first inter-die cut edge profile and the semiconductor die 12 may have a second inter-die cut edge profile, wherein the first inter-die cut edge profile and the second inter-die cut edge profile are complementary to each other. For example, as shown in FIG. 3, the semiconductor dies 51 and 52 may have complementary comb-shaped (or battlement-shaped) edge profiles. In FIG. 3, the semiconductor dies 51 and 52 with finger-like protrusions interdigitate with each other. The length of the interface between the semiconductor dies 51 and 52 is increased and therefore more die-to-die signal pads may be disposed along the interface.

According to one embodiment of the invention, the semiconductor die 11 has a continuous, nonlinear cut edge 112 that is comprised of a cut edge 112a, a cut edge 112b, and a cut edge 112c. The cut edge 112a extends along a first direction that is parallel with the reference y-axis. The cut edge 112b is contiguous with the cut edge 112a and extends along a second direction. The first direction is not in parallel with the second direction. For example, the second direction is perpendicular to the first direction, i.e. along the reference x-axis. The cut edge 112c is contiguous with the second cut edge 112b and extends along the first direction.

According to one embodiment of the invention, the semiconductor die 12 has a continuous, serpentine cut edge 122 that is comprised of a cut edge 122a, a cut edge 122b, and a cut edge 122c. According to one embodiment of the invention, the cut edge 122a extends along a first direction that is parallel with the reference y-axis. The cut edge 122b is contiguous with the first cut edge 122a and extends along a second direction that is perpendicular to the first direction, i.e. along the reference x-axis. The cut edge 122c is contiguous with the cut edge 122b and extends along the first direction.

The cut edge 112a directly faces and is in parallel with the cut edge 122a. The cut edge 112b directly faces and is in parallel with the cut edge 122b. The cut edge 112c directly faces and is in parallel with the cut edge 122c. According to one embodiment of the invention, I/O pads (or signal pads) 111a of the semiconductor die 11 are disposed along the continuous, serpentine cut edge 112 and I/O pads (or signal pads) 121a of the semiconductor die 12 are disposed along the continuous, serpentine cut edge 122. The I/O pads 111a are interconnected with the I/O pads 121a through the RDL structure 310.

The serpentine cut edge 112 of the semiconductor die 11 and the serpentine cut edge 122 of semiconductor die 12 improve the bandwidth because more regions for disposing the I/O pads are created along the interface between the semiconductor die 11 and the semiconductor die 12.

Figure 4:
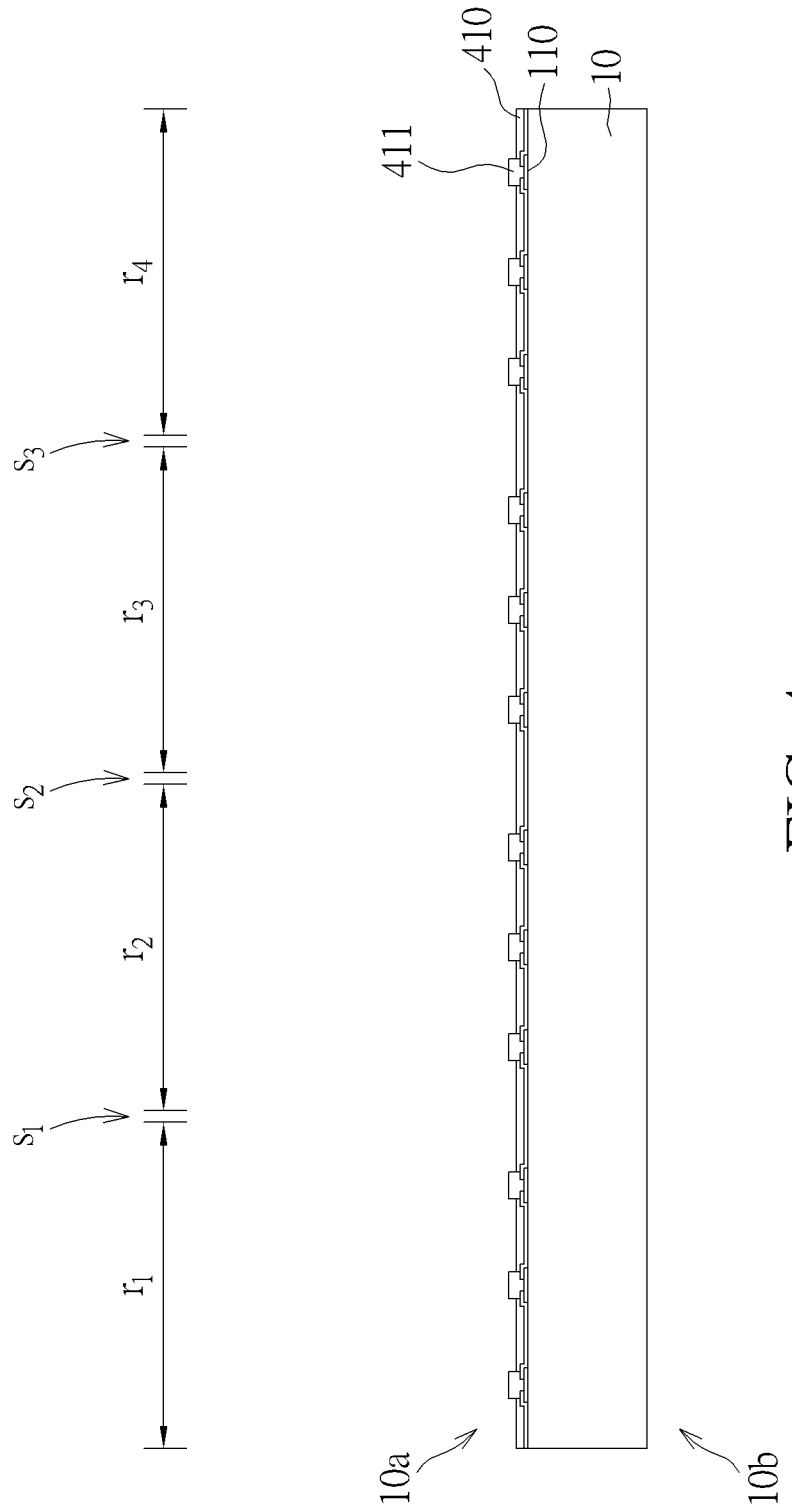
FIG. 4 to FIG. 6 are schematic, cross-sectional diagrams illustrating an exemplary method for fabricating irregular cut edges between semiconductor dies in a wafer level scale.
Figure 5:
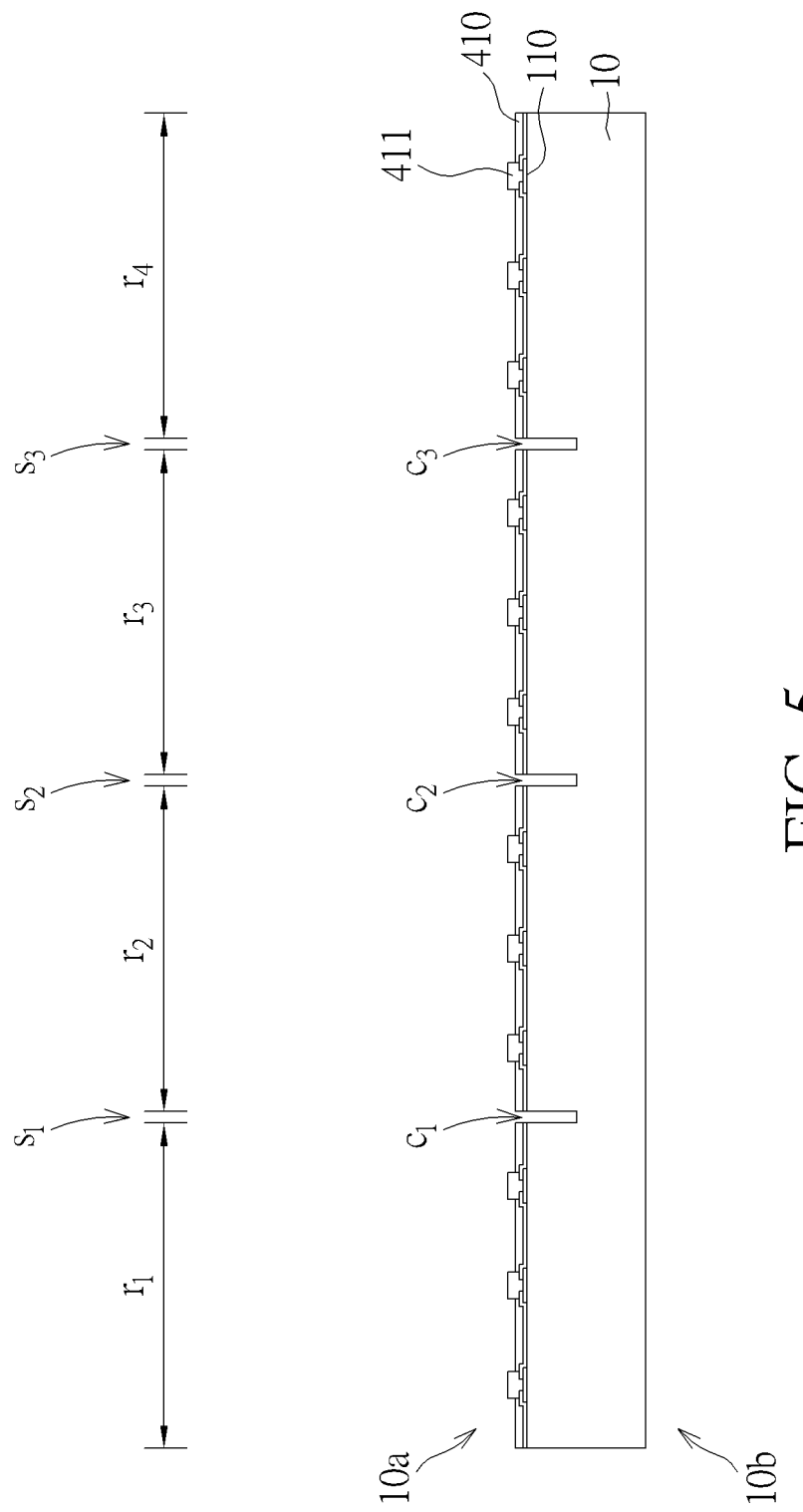
Figure 6:
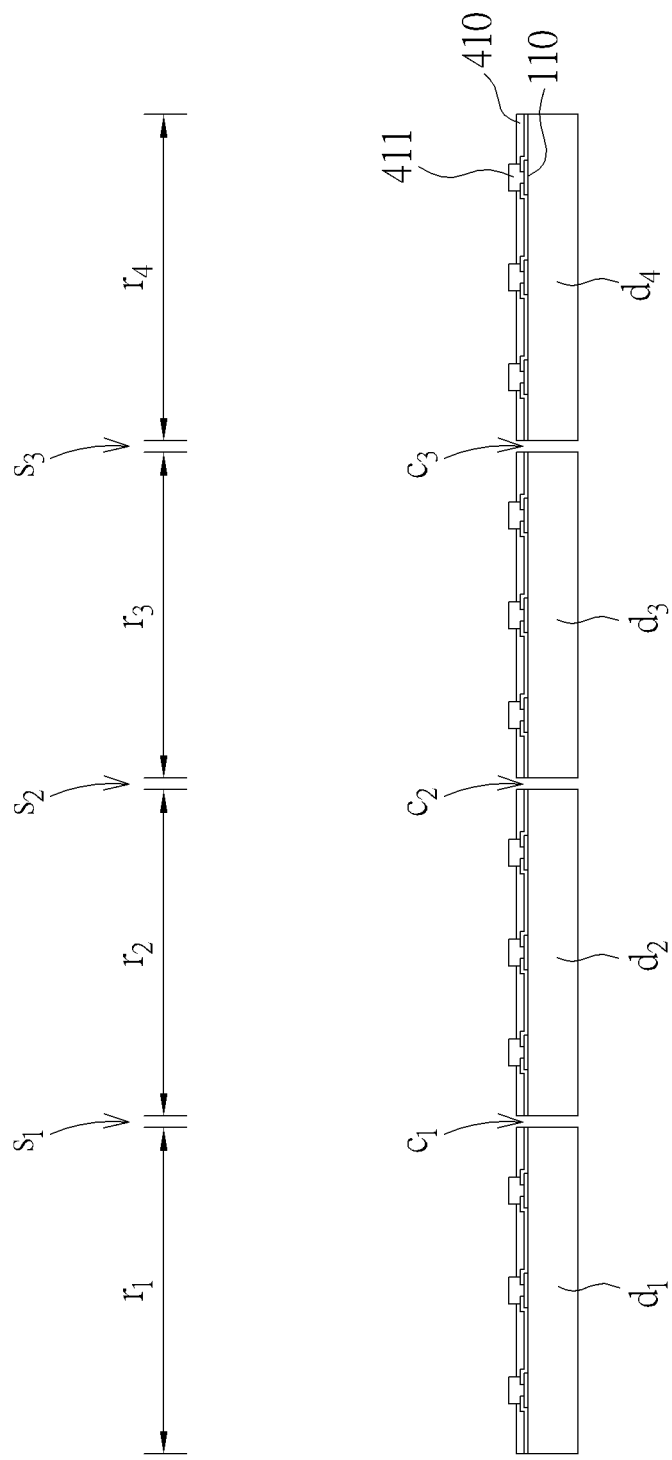

FIG. 4 to FIG. 6 illustrate an exemplary method for fabricating irregular cut edges between semiconductor dies in a wafer level scale. As shown in FIG. 4, a silicon wafer 10 comprising a plurality of die regions $r_1$~$r_4$. Within the respective die regions $r_1$~$r_4$, circuitries having specific functions are fabricated. The silicon wafer 10 has an active surface 10a and a back side 10b that is opposite to the active surface 10a.

According to one embodiment, for example, the die regions $r_1$ and $r_2$ are split die regions and may be paired and combined in a later assembly stage to achieve a complete function of a target chip, for example, a network switch chip. The die regions $r_3$ and $r_4$ are split die regions and may be paired and combined in a later assembly stage to achieve a complete function of a target chip.

According to one embodiment, a plurality of I/O pads 110 is disposed on the active surface of the silicon wafer 10. A passivation layer 410 may be formed on the active surface of the silicon wafer 10. According to one embodiment, connecting elements 411 such as micro bumps or metal pillars are formed on the I/O pads 110, respectively. Wafer sawing regions (or scribe lanes) $s_1$~$s_3$ are defined between the die regions $r_1$~$r_4$.

Subsequently, as shown in FIG. 5, an etching process is performed to partially cut the silicon wafer 10 from the active surface 10a along the wafer sawing regions $s_1$~$s_3$, thereby forming cut trenches $c_1$~$c_3$ within the wafer sawing regions $s_1$~$s_3$, respectively. The etching process may be a wet etching process or a dry etching process, and may involve a photolithographic process.

According to one embodiment, the cut trenches $c_1$~$c_3$ extend into the active surface 10a and terminate at a predetermined depth. The cut trenches $c_1$~$c_3$ do not penetrate through the entire thickness of the silicon wafer 10. The trench depth of each of the cut trenches $c_1$~$c_3$ is not greater than the total thickness of the silicon wafer 10.

According to one embodiment, when viewed from the above, the cut trenches $c_1$ between the die regions $r_1$ and $r_2$ and the cut trenches $c_1$ between the die regions $r_2$ and $r_3$ are continuous, serpentine trenches, as the cut trench illustrated in FIG. 1 or FIG. 3. According to one embodiment, when viewed from the above, the cut trench $c_2$ may be a straight line trench, but is not limited thereto.

Subsequently, as shown in FIG. 6, a wafer backside grinding process is performed to remove a portion of the silicon wafer 10 from the back side 10b until the bottom of each of the cut trenches $c_1$~$c_3$ is exposed. After the wafer backside grinding process, semiconductor dies $d_1$~$d_4$ are singulated. It is understood that although not shown in this figure, a die attaching film or a carrier may be provided on the active surface 10a of the silicon wafer 10 before and during the wafer backside grinding process.

Figure 7:
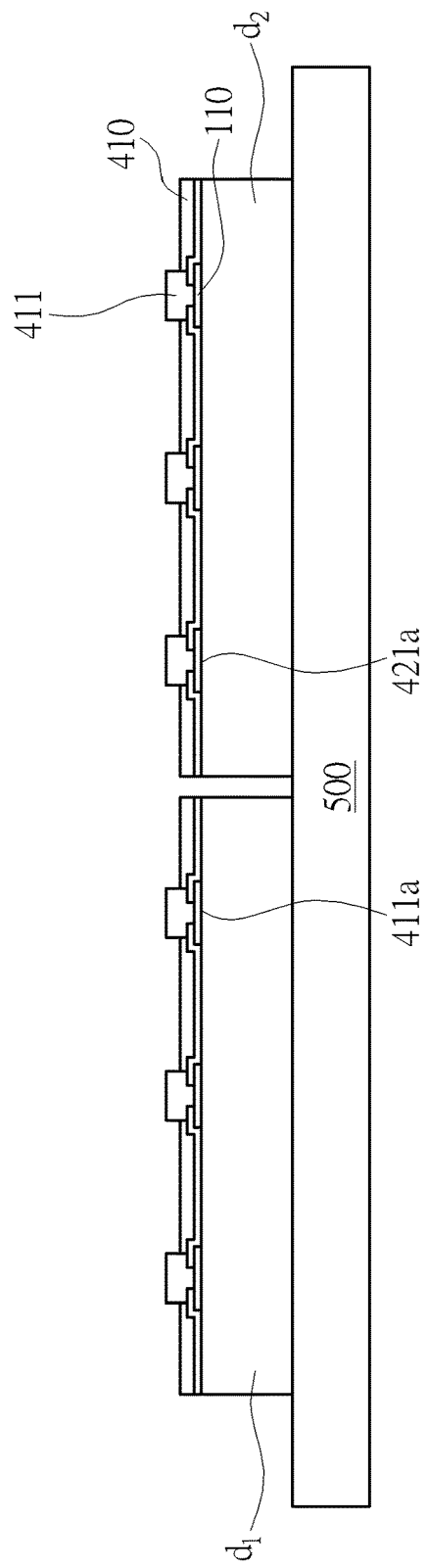
FIG. 7 and FIG. 8 illustrate an exemplary method for forming a semiconductor chip package incorporating the paired dies fabricated through FIG. 4 to FIG. 6.
Figure 8:
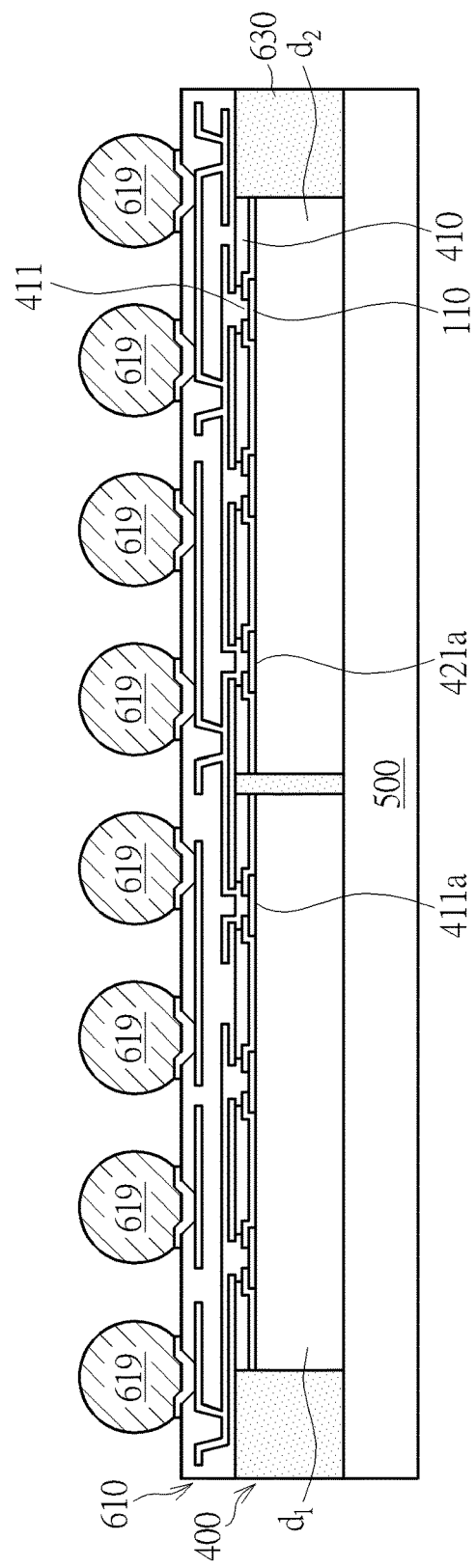

Following FIG. 6, FIG. 7 and FIG. 8 illustrate an exemplary method for forming a semiconductor chip package incorporating the paired dies fabricated through FIG. 4 to FIG. 6. As shown in FIG. 7, after the singulation process as depicted in FIG. 6, the paired dies $d_1$ and $d_2$ are picked and placed on a carrier 500. According to one embodiment, the die $d_1$ is analogous to the semiconductor die 11 and the die $d_2$ is analogous to the semiconductor die 12 as set forth in FIG. 1. When viewed form the above, similar to FIG. 1, the interface between the die $d_1$ and the die $d_2$ is a continuous, serpentine interface. Likewise, die-to-die signal pads 411a and die-to-die signal pads 421a are provided on the die $d_1$ and the die $d_2$, respectively.

As shown in FIG. 8, a molding process is then carried out to encapsulate the die $d_1$ and the die $d_2$ with a molding compound 630. Subsequently, redistribution layer (RDL) structure 610 is fabricated on the die $d_1$, the die $d_2$, and also on the molding compound 630 beyond the outer edges of the die $d_1$ and the die $d_2$. The die-to-die signal pads 411a and die-to-die signal pads 421a are interconnected through the RDL structure 610. After forming the RDL structure 610, conductive bumps 619 such as C4 bumps are formed on the respective connection pads of the RDL structure 610. The carrier 500 is then removed and the fabrication of the semiconductor chip package 400 is complete.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor chip package, comprising:
    a first semiconductor die and a second semiconductor die, wherein the first semiconductor die and second semiconductor die are coplanar and disposed in proximity to each other in a side-by-side fashion;
    a non-straight line shaped interface gap between the first semiconductor die and second semiconductor die;
    a molding compound surrounding the first semiconductor die and second semiconductor die; and
    a redistribution layer (RDL) structure on the first semiconductor die, the second semiconductor die and on the molding compound, wherein the first semiconductor die is electrically connected to the second semiconductor die through the RDL structure.

2. The semiconductor chip package according to claim 1, wherein the first semiconductor die and the second semiconductor die have identical circuit module design.

3. The semiconductor chip package according to claim 1, wherein the first semiconductor die has a first inter-die cut edge and the second semiconductor die has a second inter-die cut edge along the non-straight line shaped interface gap, wherein the first inter-die cut edge and the second inter-die cut edge are complementary to each other.

4. The semiconductor chip package according to claim 3, wherein the first semiconductor die comprises a plurality of first input/output (I/O) pads disposed along the first inter-die cut edge and the second semiconductor die comprises a plurality of second input/output (I/O) pads disposed along the second inter-die cut edge.

5. The semiconductor chip package according to claim 4, wherein the plurality of first I/O pads is electrically connected to the plurality of second I/O pads through the RDL structure.

6. The semiconductor chip package according to claim 3, wherein the first inter-die cut edge and the second inter-die cut edge both have a serpentine profile.

7. A semiconductor chip package, comprising:
    a first semiconductor die and a second semiconductor die, wherein the first semiconductor die and second semiconductor die are coplanar and disposed in proximity to each other in a side-by-side fashion;
    a continuous interface gap between the first semiconductor die and the second semiconductor die separating the first semiconductor die from the second semiconductor die, wherein the continuous interface gap comprises a first gap segment extending along a first direction and a second gap segment extending along a second direction that is not in parallel with the first direction;
    a molding compound surrounding the first semiconductor die and second semiconductor die; and
    a redistribution layer (RDL) structure on the first semiconductor die, the second semiconductor die and on the molding compound, wherein the first semiconductor die is electrically connected to the second semiconductor die through the RDL structure.

8. The semiconductor chip package according to claim 7, wherein the first semiconductor die and the second semiconductor die have identical circuit module design.

9. The semiconductor chip package according to claim 7, wherein the first semiconductor die has a first inter-die cut edge and the second semiconductor die has a second inter-die cut edge along the non-straight line shaped interface gap, wherein the first inter-die cut edge and the second inter-die cut edge are complementary to each other.

10. The semiconductor chip package according to claim 9, wherein the first semiconductor die comprises a plurality of first input/output (I/O) pads disposed along the first inter-die cut edge and the second semiconductor die comprises a plurality of second input/output (I/O) pads disposed along the second inter-die cut edge.

11. The semiconductor chip package according to claim 10, wherein the plurality of first I/O pads is electrically connected to the plurality of second I/O pads through the RDL structure.

12. The semiconductor chip package according to claim 9, wherein the first inter-die cut edge and the second inter-die cut edge both have a serpentine profile.

13. A semiconductor chip package, comprising:
    a first semiconductor die and a second semiconductor die, wherein the first semiconductor die and second semiconductor die are coplanar and disposed in proximity to each other in a side-by-side fashion, wherein the first semiconductor die and the second semiconductor die have identical circuit module design;
    a non-straight line shaped interface gap between the first semiconductor die and second semiconductor die;
    a molding compound surrounding the first semiconductor die and second semiconductor die; and
    a redistribution layer (RDL) structure on the first semiconductor die, the second semiconductor die and on the molding compound, wherein the first semiconductor die is electrically connected to the second semiconductor die through the RDL structure.

14. The semiconductor chip package according to claim 13, wherein the first semiconductor die has a first inter-die cut edge and the second semiconductor die has a second inter-die cut edge along the non-straight line shaped interface gap, wherein the first inter-die cut edge and the second inter-die cut edge are complementary to each other.

15. The semiconductor chip package according to claim 14, wherein the first semiconductor die comprises a plurality of first input/output (I/O) pads disposed along the first inter-die cut edge and the second semiconductor die comprises a plurality of second input/output (I/O) pads disposed along the second inter-die cut edge.

16. The semiconductor chip package according to claim 15, wherein the plurality of first I/O pads is electrically connected to the plurality of second I/O pads through the RDL structure.

17. The semiconductor chip package according to claim 13, wherein the first inter-die cut edge and the second inter-die cut edge both have a serpentine profile.

18. The semiconductor chip package according to claim 13, wherein the first semiconductor die has an L-shaped profile and the second semiconductor die has a reversed L-shaped profile.

* * * * *